United States Patent [19]

Kimura

[11] Patent Number: 4,583,041
[45] Date of Patent: Apr. 15, 1986

[54] LOGIC CIRCUIT TEST SYSTEM

[75] Inventor: Shigehiro Kimura, Gyoda, Japan

[73] Assignee: Takeda Riken Co., Ltd., Tokyo, Japan

[21] Appl. No.: 615,793

[22] Filed: May 31, 1984

[30] Foreign Application Priority Data

May 31, 1983 [JP] Japan ................. 58-96049
May 31, 1983 [JP] Japan ................. 58-96050
Mar. 28, 1984 [JP] Japan ................. 59-60331

[51] Int. Cl.⁴ ................. G01R 31/28; G06F 11/04
[52] U.S. Cl. ................. 324/73 R; 371/25
[58] Field of Search .......... 324/73 R, 73 PC, 73 AT; 371/25, 26, 27

[56] References Cited

U.S. PATENT DOCUMENTS 4,097,797 6/1978 Finet ................. 324/73 R
4,176,780 12/1979 Sacher et al. ................. 371/25

Primary Examiner—Ernest F. Karlsen
Attorney, Agent, or Firm—Staas & Halsey

[57] ABSTRACT

A test system for simultaneously testing a plurality of logic circuits first sets them all to an initial state before beginning testing. The faulty logic circuits which cannot be set to the initial state can be identified, and the testing of the others can proceed, even after only one cycle of attempting to initialize all the logic circuits. If all the logic circuits are faulty, the further testing can be prevented.

9 Claims, 9 Drawing Figures

LOGIC CIRCUIT TEST SYSTEM

BACKGROUND OF THE INVENTION

This invention relates to a logic circuit test system for testing a logic circuit by supplying test patterns to the logic circuit and by comparing response outputs from the logic circuit with expected patterns, and more particularly to a logic circuit test system capable of adjusting the internal state of a plurality of logic circuits under test to the identical initial state and of testing the plurality of logic circuits simultaneously after the adjustment.

In testing a logic circuit, test patterns and expected patterns are simultaneously generated by a pattern generator provided in the logic circuit test system. The test patterns are supplied to a logic circuit under test and the resulting outputs from the logic circuit are compared by a comparator with the expected patterns to determine whether the logic circuit works correctly or not.

FIG. 1 shows a block diagram of a logic circuit test system of this kind. A pattern generator 11 generates a test pattern D and an expected pattern E simultaneously. The test pattern D is provided to a logic circuit 13 that is to be tested (device under test. DUT) after being shaped by a formatter 12 to predetermined logic waveforms, such as return-to zero (RZ) and non-return-to zero (NRZ) signals. The expected pattern E is delayed by a delay circuit 14 for a time corresponding to the operation delay times of the logic circuit 13 and the formatter 12. The output data from the logic circuit 13 and the expected pattern from the delay circuit 14 are compared with each other and the resulting comparison signal is provided at a terminal 41 at the timing of strobe signals from a terminal 42.

Prior to supplying the test patterns to the logic circuit under test, the logic circuit under test has to be set to an initial state for applying the test patterns for the actual testing procedure beginning with the initial state. In some logic circuits, such as microprocessors or watch circuits and the like, for initialization, the internal state is incremented cyclically by a specific logic pattern inherent to the logic circuit (hereinafter referred to as the increment pattern).

By incrementing the internal state a predetermined number of times, for example 60 times, the internal state returns to the initial state. That is, with every incrementing of the internal state 60 times, as in the above example, the initial state of the logic circuit is repeatedly set.

The number of times of applying the increment pattern to the logic circuit for repeating the same internal state is inherent to the logic circuit and is known from, for example, the technical description of the logic circuit under test. However, the internal state of the logic circuit under test at the time of beginning the application of the increment pattern is not known, since the internal state at that time depends on the previous operation of the logic circuit, or on the uncertainty which ocurred when switching on the source power. Thus, in the above example of repeating the same internal state every time the increment pattern is applied 60 times, there is a possibility that the first initial state will occur for the first time on applying the increment pattern anywhere from 0 to 59 times, depending on the internal state just prior to applying the increment pattern.

For initializing and testing a logic circuit of this kind, in the logic system of FIG. 1, the pattern generator 11 repeatedly generates an increment pattern corresponding to the logic circuit 13 that is to be tested, for incrementing the internal state, and an expected pattern which indicates the initial state of the logic circuit under test. The increment pattern is provided to the logic circuit 13, and the resulting output from the logic circuit 13 is compared with the expected pattern by the comparator 15 for detecting the initial state. When the output signal from the logic circuit 13 and the expected pattern coincide with each other, a coincidence signal is generated by the comparator 15 so that a logic circuit test is started by applying test patterns for the actual test for evaluating the logic circuit 13 beginning with its initial state.

However, in the conventional logic circuit test system of FIG. 1, it is not possible to simultaneously test a plurality of logic circuits whose initial states are set by an increment pattern as mentioned above. For testing the plurality of logic circuits simultaneously in the logic test system of FIG. 1, the increment pattern and the test pattern have to be provided commonly to all the logic circuits. Since the increment pattern is provided commonly to the plurality of logic circuits, a logic circuit which has been set to the initial state earlier than another logic circuit is changed to another internal state by the increment pattern when the other logic circuit is set to the initial state.

Because of recent development in semiconductor logic circuits, logic circuit test systems for testing these logic circuits have become complicated and expensive. When using such an expensive logic test system, there is a strong demand for raising the efficiency of the test so as to reduce the cost of testing logic circuits. One of the methods for increasing the test efficiency is to test a plurality of logic circuits simultaneously with one logic test system, by applying test patterns commonly to all the logic circuits. That is, in the logic circuit test system which can test a logic circuit having up to 256 terminal pins, for example, six logic circuits, each of which as an example may have for instance 40 terminal pins in this example, can be tested in parallel at the same time. In testing a plurality of logic circuits in this manner, the test pattern has to be applied commonly to the plurality of logic circuits, because it is not feasible to generate different test patterns for each logic circuit by programming.

SUMMARY OF THE INVENTION

It is an object of the present invention to provide a logic circuit test system which is capable of simultaneously testing a plurality of logic circuits whose initial states are obtained simply by repeatedly supplying an increment pattern a predetermined number of times.

It is another object of the present invention to provide a logic circuit test system which is capable of detecting faulty logic circuits which cannot be set to the initial state, from among the plurality of logic circuits being tested, and of masking and thus eliminating the data from the faulty logic circuits for executing a logic test for the other logic circuits.

It is another object of the present invention to provide a logic circuit test system which is capable of automatically detecting and masking the faulty logic circuits in the initializing operation, and of starting a logic test for the normal logic circuits which can be set to the initial state.

It is a further object of the present invention to provide a logic circuit test system which is capable of testing a plurality of logic circuits with high efficiency.

According to this invention there are provided, a hold command circuit for generating hold command signals when the internal state of logic circuits under test reach the initial state, hold circuits for holding the increment pattern temporarily when the hold command signals are supplied thereto, and a coincidence signal generating circuit for generating an overall coincidence signal when the internal states of all the logic circuits under test are set to the initial state.

The plurality of logic circuits are repeatedly supplied with the increment pattern, and their outputs are compared by comparators with an expected pattern which indicates the initial state. The internal states of the plurality of logic circuits are thusly incremented to the initial state, and, upon each occurrence of the initial state, respective coincidence signals are generated by the comparators. The hold command signal is generated by the corresponding hold command circuit upon the occurrence of the coincidence signal from the respective comparator. By the hold command signal, the hold circuit corresponding to the logic circuit under test which has attained the initial state holds the increment pattern until all the other logic circuits under test attain the initial state.

While the increment pattern is being held at the hold circuit, the internal state of the corresponding logic circuit is not incremented, since the increment pattern is not repeatedly supplied to the logic circuit. Therefore, the internal state of the logic circuit keeps the initial state until the hold command signal is cancelled. If another logic circuit reaches the initial state in the next period, the hold circuit corresponding to this other logic circuit holds the increment pattern, so that the initial state is maintained in this other logic circuit as well. Meanwhile, the increment pattern is continued to be supplied to the remaining logic circuits whose internal states are not yet set to the initial state.

When all the logic circuits reach the initial state, the overall coincidence signal is generated by the overall coincidence signal generating circuit. By the overall coincidence signal, all the hold circuits are reset so that the real test patterns from the pattern generator are supplied commonly to all the logic circuits. Thus, after obtaining the initial state in all the logic circuits, all the logic circuits can be tested simultaneously by applying the test patterns in parallel to the indentical internal states.

Further in this invention, detecting circuits are provided for detecting faulty logic circuits in the case where some of the logic circuits cannot attain the initial state as a result of repeatedly applying the increment pattern because of a defect, etc., and masking means is provided for masking the data from the faulty logic circuits so as to isolate the data from the other logic circuits. That is, if the overall coincidence signal is not obtained within the predetermined time, the initializing operation stops temporarily, and each data corresponding to the internal state of each logic circuit is read out, to detect the faulty logic circuits. After detecting the faulty logic circuits, the initializing operation is again performed for the normal logic circuits while the faulty logic circuits are masked by the masking means. Therefore, in the case where faulty logic circuits are contained among the plurality of logic circuits under test, the overall coindicence signal can be obtained when all the normal logic circuits, that is, excluding the faulty logic circuits, attain the initial state. After obtaining the overall coincidence signal, the desired logic circuit test can be performed for the normal logic circuits.

Further, in accordance with the present invention, a timer is provided for generating a time signal at a predetermined time after the state of the initializing operation. This predetermined time is selected to be equal to or slightly larger than the longest time required for all the logic circuits under test to first attain the initial state when supplied with the increment pattern and when all the logic circuits are normal. In synchronism with the time signal, the overall coincidence signal is compulsorily generated even when faulty logic circuits are present. Also, by the time signal, data indicating the internal state of each logic circuit at the occurrence of the time signal are stored. If the read out data contains data indicating a different internal state than the initial state, the circuit components of the logic test system corresponding to the faulty logic circuits are masked so that the normal logic circuits can be tested without regard to the faulty logic circuits.

This detection and masking operates automatically, so that the testing for the logic circuits other than the faulty logic circuits can be started immediately after generation of the overall coincidence signal, without repeating the initializing operation.

DESCRIPTION OF THE PREFERRED EMBODIMENTS

Figure 1:
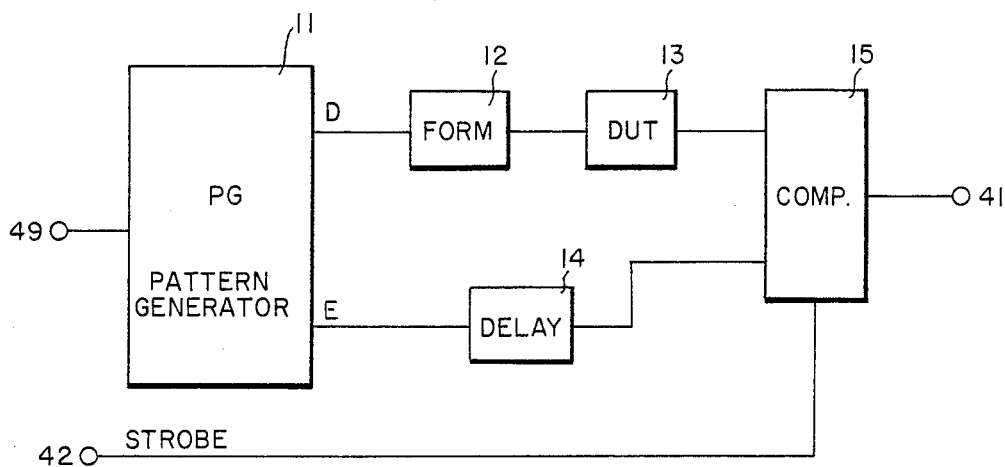
FIG. 1 shows a block diagram of a conventional logic circuit test system.
Figure 2:
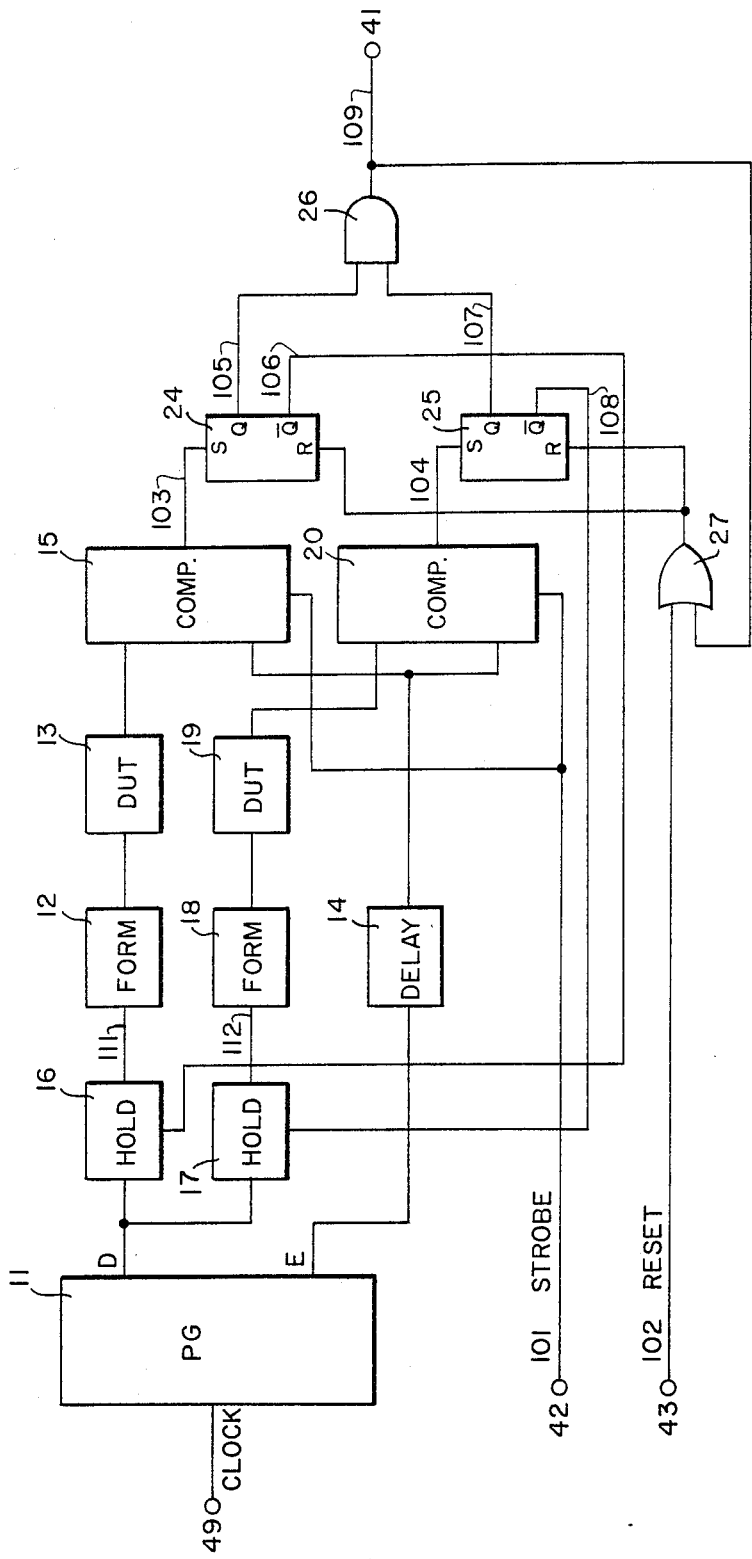
FIG. 2 shows a circuit diagram of one of the embodiments of the present invention.

FIG. 2 shows a circuit diagram of a preferred embodiment of the present invention. In FIG. 2 the components that are identical to those in FIG. 1 are denoted by the same reference characters. In this example, the case of testing two logic circuits is shown for simplicity of explanation, although it is clear that three or more logic circuits can be tested in a similar manner according to the present invention.

A pattern generator 11 generates test pattern D and expected pattern E in synchronism with the clock signal from a terminal 49. Reference numerals 16 and 17 indicate hold circuits which provide test patterns from the pattern generator 11 to formatters 12 and 18, respectively, when hold command signals are not provided, and hold the test pattern when the hold command signals are provided. The formatters 12 and 18 wave-shape the test pattern to appropriate waveforms, such as RZ and NRZ waveforms, and provide the wave-shaped test patterns to the logic circuits 13 and 19 that are to be tested simultaneously. Comparators 15 and 20 compare output data from the logic circuits 13 and 19 with the expected pattern from a delay circuit 14, with the timing of strobe signals from a terminal 42. Comparison results from the comparators 15 and 20 are provided to flip-flop 24 and 25, respectively.

Accordingly, when the output from the logic circuit under test and the expected pattern coincide with each other, the Q output of the corresponding flip-flop goes to high level. Each Q output of the flip-flops 24 and 25 is provided to an AND gate 26, and the $\overline{Q}$ outputs are provided to the hold circuits 16 and 17, respectively, to serve as the hold command signals. The output of the AND gate 26 is provided to a controller (not shown) through terminal 41, and also to an OR gate 27. The other input terminal of the OR gate is provided with a reset pulse from terminal 43. The output of the OR gate is connected to the reset terminals R of the flip-flops 24 and 25.

Figure 3:
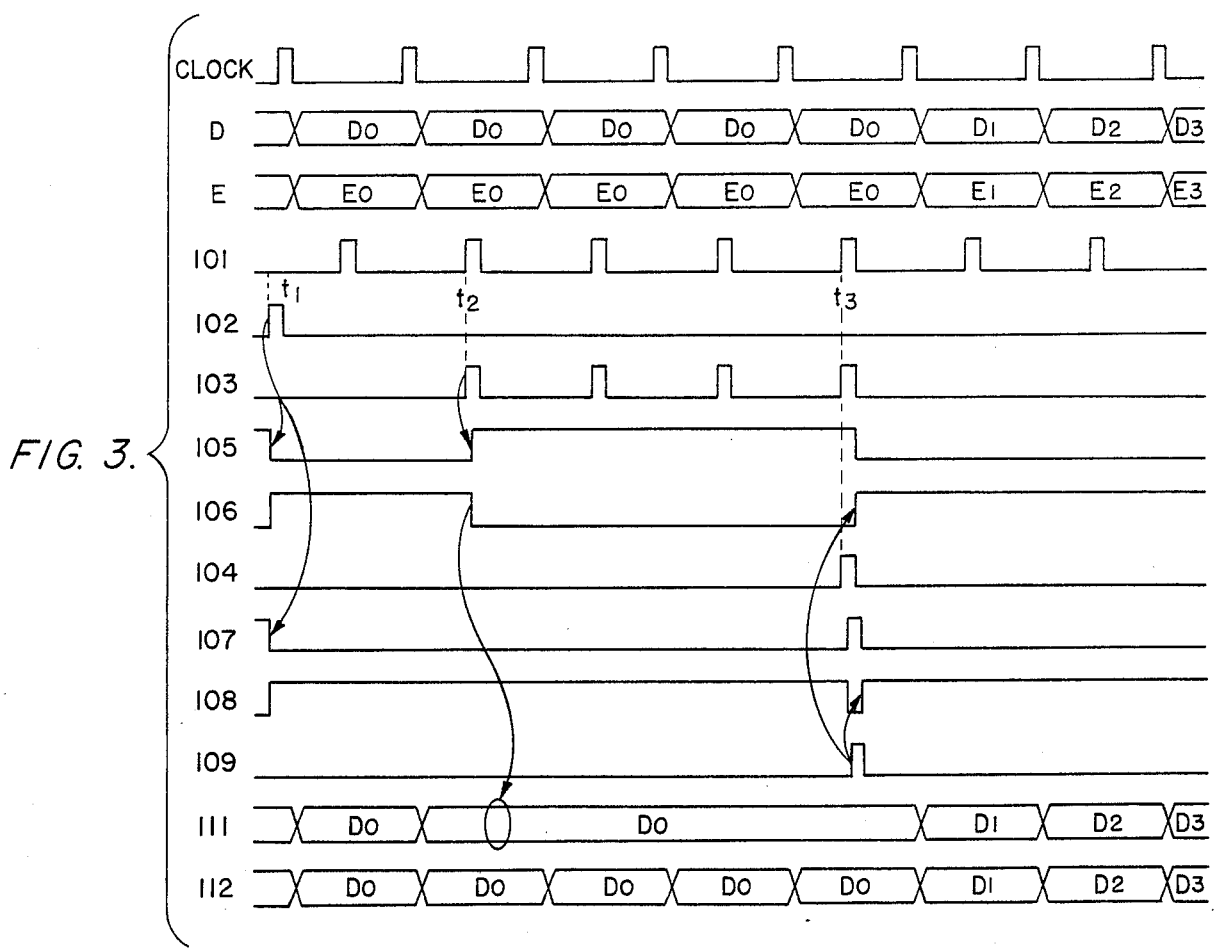
FIG. 3 is a timing chart for explaining the operation of the embodiment of FIG. 2.

FIG. 3 is a timing chart for explaining the operation of the embodiment of FIG. 2. In synchronism with the clock signal from the terminal 49, the pattern generator 11 generates a test pattern D and an expected pattern E. As described above, for testing a plurality of logic circuits simultaneously by applying the test pattern commonly to all the logic circuits, it is necessary to set the internal states of all the logic circuits to the identical initial state. Thus, prior to generating a desired test pattern and an expected pattern for an actual test, the pattern generator 11 provides an increment pattern $D_0$ for incrementing the internal states of the logic circuits and an expected pattern $E_0$ which indicates the intial state of the logic circuits, for initializing the internal state of all the logic circuits under test.

At the start of this initializing operation, at time $t_1$, a reset signal 102 from a terminal 43 is supplied to the flip-flop 24, 25 through the OR gate 27, so that the flip-flops 24 and 25 are reset. With the timing of the strobe signal 101, comparison signals are derived from the comparators 13 and 19. In this example, it is assumed that the logic circuit 13 attains its initial state by receiving the increment pattern two times, that is, at time $t_2$, at which time a coincidence signal 103 is generated by the comparator 15 so as to set the flip-flop 24. As a result, the Q output 105 of the flip-flop 24 becomes high level and the $\overline{Q}$ output 106 becomes low level. By this $\overline{Q}$ output, the output 111 of the hold circuit 116 is held and kept unchanged, so as not to increment the internal state of the logic circuit 13 until the other logic circuit 19 attains the initial state.

Since the logic circuit 19 is still not in the initial state, the increment pattern $D_0$ is further repeatedly applied to the logic circuit 19. In this example, it is also assumed that the internal state of the logic circuit 19 is set to the initial state by the fifth increment position. When the logic circuit 19 is set to the initial state by receiving the increment pattern five times, at time $t_3$, the coincidence signal 104 is derived from the comparator 20, so that the Q output 107 of the flip-flop 25 goes to high level, and the $\overline{Q}$ output 108 goes down to low level so as to hold the increment pattern in the hold circuit 17.

Therefore, in this example, all the logic circuits under test are set to be initial state at time $t_3$, and both outputs of flip-flops 24 and 25 are at high level, so that an overall coincidence signal 109, which indicates that all the logic circuits under test coincide with the expected pattern indicating the intial state, is generated by the AND gate 26. Accordingly, the flip-flops 24 and 25 are reset by the overall coincidence signal through the OR gate 27, and the hold circuits 16 and 17 are stopped from holding the increment pattern $D_0$. By the coincidence signal 109 provided from the terminal 41, the controller can judge that all the logic circuits under test are set to the initial state, so that the controller instructs the pattern generator 11 to start the actual testing to be performed. After that, the actual patterns $D_1, D_2, D_3 \ldots$, and the actual expected patterns $E_1, E_2, E_3 \ldots$ are generated by the pattern generator 11 so as to provide them commonly to the plurality of logic circuits.

As has been described, according to this invention, even when time differences occur among the plurality of logic circuits for achieving the initial state, the logic circuits which attained the initial state earlier than the others wait until the last logic circuit achieves the initial state without changing their internal states from the initial state. Therefore, it is possible to provide all the logic circuits under test with the identical initial state, and thus all the logic circuits can be tested simultaneously by applying the test patterns in parallel, beginning with the initial state. During the actual logic circuit testing, that is, after the initialization, the outputs of the comparators 15 and 20 are directly provided to the controller.

Figure 4:
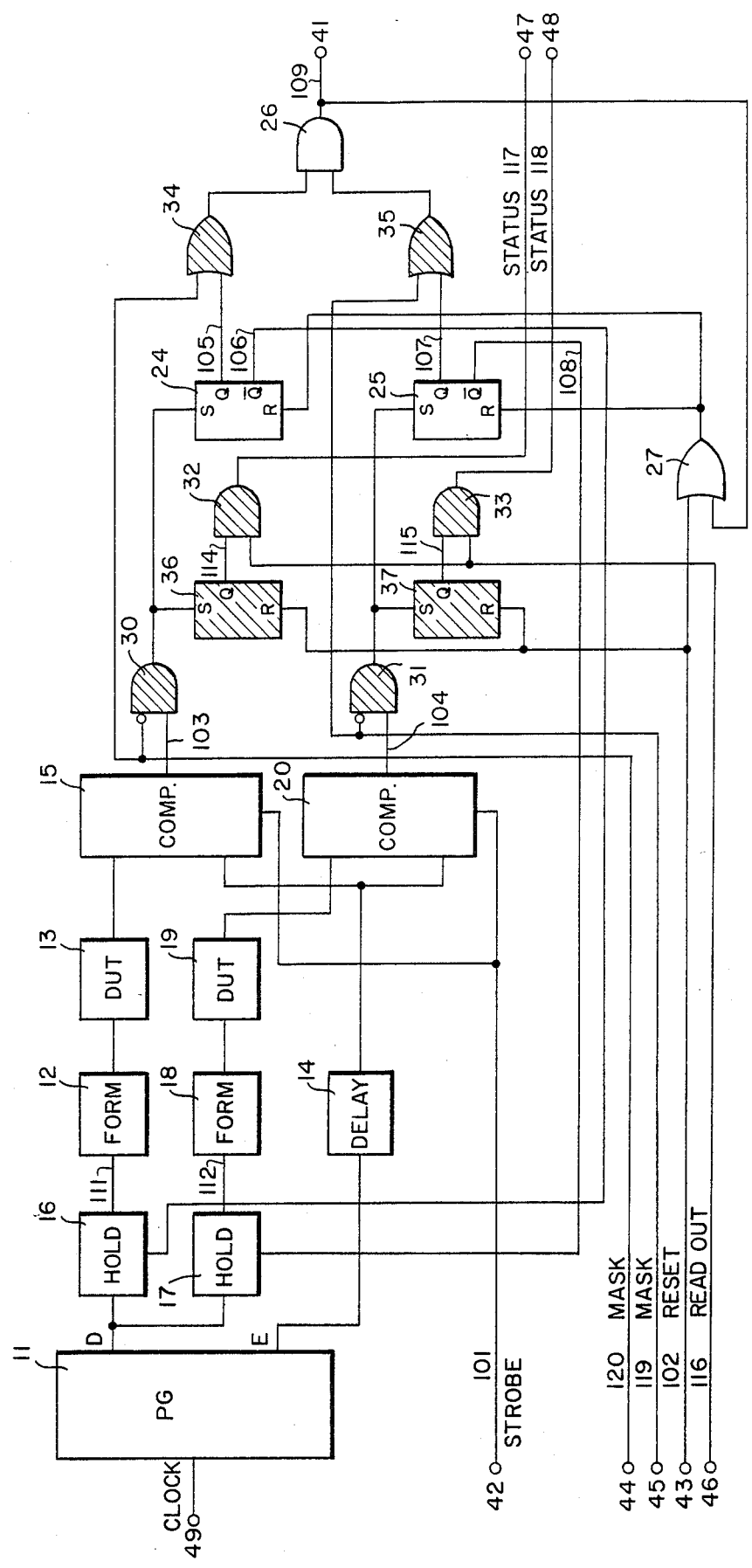
FIG. 4 shows a circuit diagram of another embodiment of the present invention.

FIG. 4 shows another embodiment of the present invention. In FIG. 4, the shaded components are added to the circuit diagram of FIG. 2. In the embodiment of FIG. 2, in the case where faulty circuits wherein the initial state cannot be obtained are present among the plurality of logic circuits under test, the overall coincidence signal is not generated after providing the increment pattern by the predetermined number of times. Thus it is not possible to test the normal logic circuits, since the controller is not provided with the overall coincidence signal and, accordingly, the controller cannot judge when to start the actual logic test. In the embodiment of FIG. 4, when the overall coincidence signal is not generated, the faulty logic circuits can be detected by reading out outputs of the flip-flop provided for each logic circuit under test, and the data from the detected faulty logic circuits can then be masked so as not to interrupt the initializing operation for the other normal logic circuits. After masking the faulty logic circuits, the initializing operation again proceeds for the normal logic circuits.

Again for simplicity of explanation, in FIG. 4 a circuit diagram for initializing and testing two logic circuits is illustrated, and the components that are identical to those in FIG. 2 are denoted by the same reference characters. Flip-flops 36 and 37 are provided for being set by the coincidence signals from the comparatos 15 and 20, respectively. Outputs of the flip-flop 36 and 37 are read out at terminals 47 and 48, respectively, through AND gates 32 and 33 when a reading out signal from terminal 46 is supplied to the AND gates 32 and 33. The reading out signal is supplied at the terminal 46 to detect which logic circuits are faulty when the overall coincidence signal is not obtained. The flip-flops 24, 25, 36 and 37 are reset by the reset signal from terminal 43 at the start of the initializing operation.

The coincidence signals from the comparators 15 and 20 are provided to the flip-flops 24, 36 and 25, 37 through AND gates 30 and 31, respectively. The other inputs of the AND gates 30 and 31 are connected to terminals 44 and 45, respectively, for being provided with the masking signals. When it is necessary to mask a faulty logic circuit, the corresponding masking signal at the terminal 44 or 45 is set to high level. The Q outputs of the flip-flops 24 and 25 are connected to OR gates 34 and 35 whose other input terminals are provided with the masking signals from the terminals 44 and 45. The outputs of both the OR gates 34 and 35 are provided to the AND gate 26. That is, when the masking signal is supplied to the AND gate 30 or 31, the corresponding input terminal of the AND gate 26 becomes high level regardless of the internal state of the corresponding logic circuit.

Figure 5:
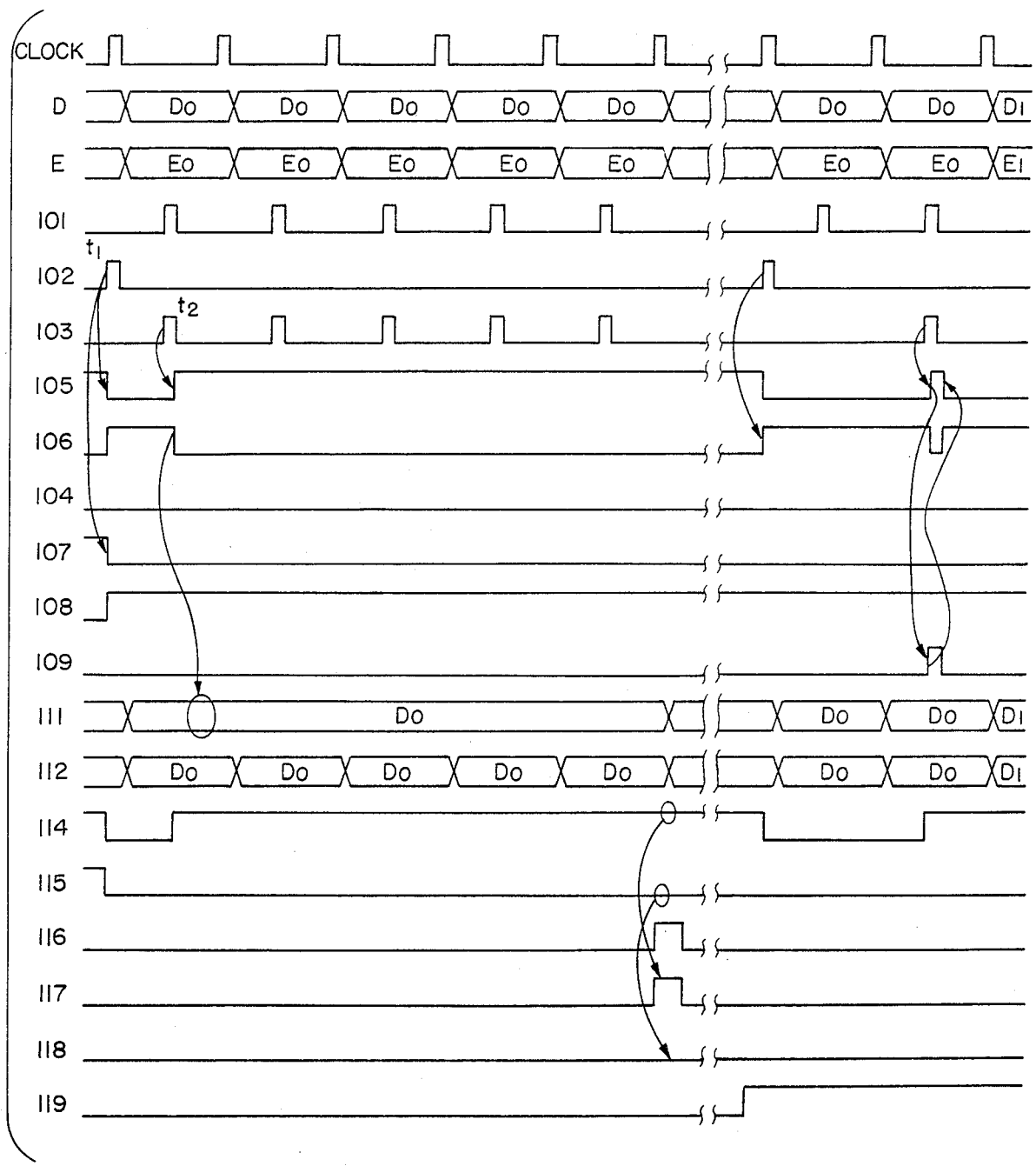
FIG. 5 is a timing chart for explaining the operation of the embodiment of FIG. 4.

FIG. 5 shows a timing chart for explaining the operation of the embodiment of FIG. 4. In this example, it is assumed that the logic circuit 19 is faulty so that a coincidence signal 104, which indicates an agreement with the initial state, is not generated from the comparator 20 when repeatedly providing the increment pattern $D_0$ to the logic circuit 19. At the start of the initializing operation, the flip-flops 24, 25, 36 and 37 are reset by the reset signal 102 at time $t_1$. In the same way as in regard to FIGS. 2 and 3, the pattern generator 11 sequentially generates the increment pattern $D_0$ and the expected pattern $E_0$ in synchronism with the clock signal from the terminal 49. Outputs from the logic circuits 13 and 19 are compared with the expected pattern $E_O$ by the comparators 15 and 20, respectively, with the timing of the strobe signal 101 from the terminal 42, and when they coincide with each other, the outputs of the comparators 15 and 20 are changed to high level.

In this example, the logic circuit 13 is set to the initial state by the first increment pattern, so that the output signal 103 of the comparator 15 becomes high level at time $t_2$. As a result, the Q output 105 of the flip-flop 24 is changed to high level and provided to the OR gate 34. By the $\overline{Q}$ output 106 of the flip-flop 24, the hold circuit 16 stops repeatedly providing the increment pattern $D_0$ to the logic circuit 13 and holds it until the overall coincidence signal 109 is generated. At the same time, the flip-flop 36 is also set to high level by the coincidence signal 103 and its output signal 114 is provided to the AND gate 32. The output signal 104 of the comparator 20 does not go to high level by further providing the increment pattern, since the logic circuit 19 is faulty. As a result, neither of the flip-flops 25 and 37 can change state, so that the output signals 107 and 115 remain at low level, and thus the overall coincidence signal 109 is not generated by the AND gate 26 by applying the increment pattern a certain number of times.

The controller (not shown) judges that faulty logic circuits are present among the plurality of logic circuits, since the overall coincidence signal is not provided from terminal 41 within the predetermined time after the reset signal 102. Namely, on the maximum time required for obtaining the first initial state, regardless of the internal state of the logic circuits under test at the start of the initializing operation, is known and is provided to the controller. Accordingly, the controller can determine whether faulty logic circuits exist or not by observing the timing of the overall coincidence signal.

The controller stops the initializing operation and provides the reading out signal 116 from the terminal 46 to find out which logic circuits are faulty. By the reading out of the signal 116, the AND gates 32 and 33 are opened, so that the output signals 114 and 115 of the flip-flops 36 and 37 are read out at terminals 117 and 118, respectively. The signal at the terminal 117 is at high level, whereas the signal at the terminal 118 is at low level. Thus it can be detected that the logic circuit 19 is faulty. Accordingly, masking signal 119 is supplied to the AND gate 31 and the OR gate 35 for masking the comparison result from the comparator 20 and for providing a high level signal to the AND gate 26.

After that, the initializing operation is again allowed to proceed by generating the increment pattern $D_0$ and the expected pattern $E_0$ from the pattern generator 11. Since the output of the OR gate 35 is at high level without regard to the comparison result from the comparator 20, in accordance with the masking signal 119, an overall coincidence signal is generated when the other normal logic circuits, in this example, the logic circuit 13, reach the initial state. Therefore, the real logic test can be started for the logic circuit 13 by applying the test pattern $D_1, D_2, D_3 \ldots$ after the initial state is attained.

As has been described, according to this invention, even when faulty logic circuits are contained among the plurality of logic circuits under test, the faulty logic circuits can be detected at the initialization stage. Then the initializing operation proceeds while the faulty logic circuits are masked by the masking signal, so that the initial state can be set in all the other logic circuits. After that, the real logic test can be executed for the other normal logic circuits by applying the test pattern for the actual test.

Figure 6:
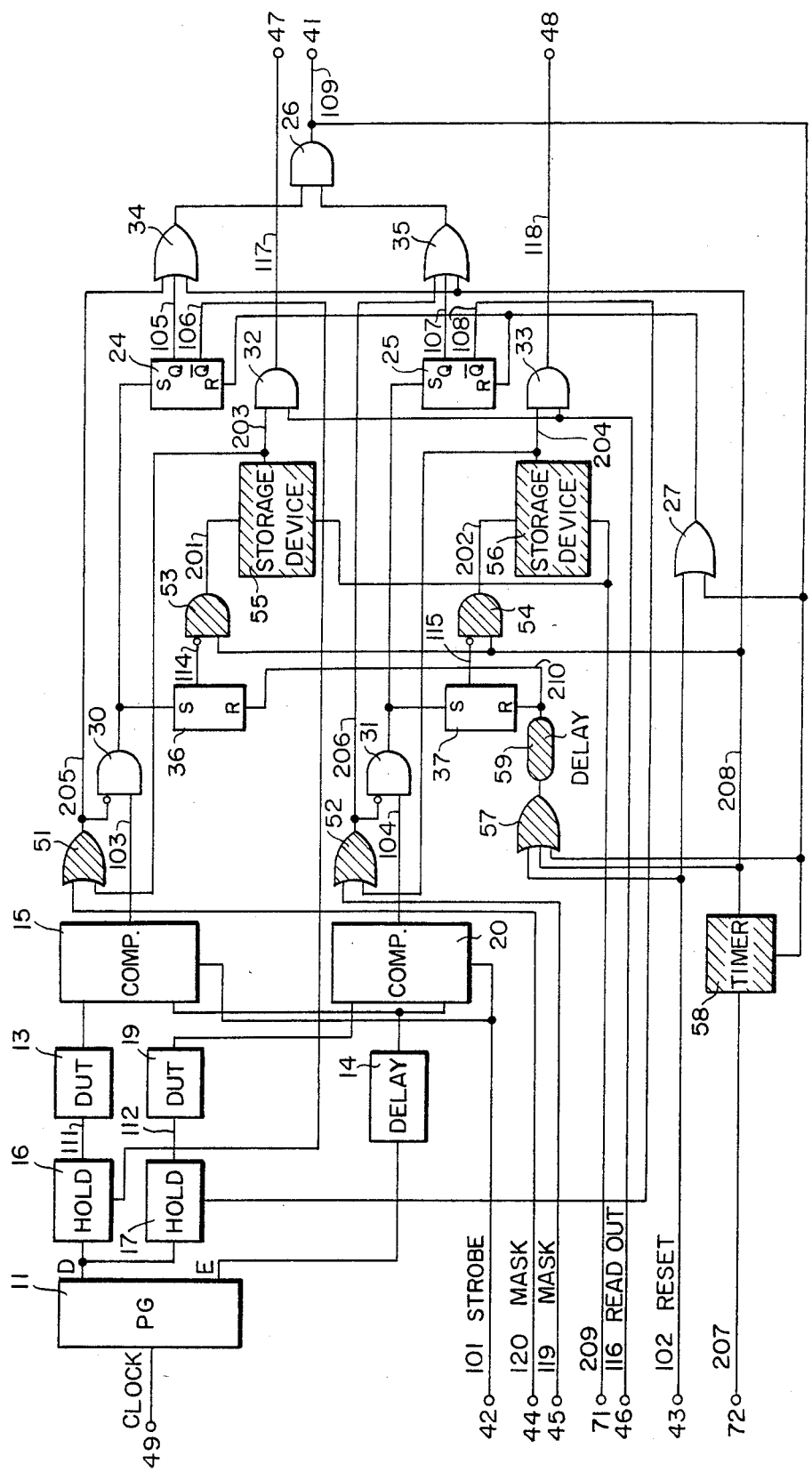
FIG. 6 shows a circuit diagram of another embodiment of the present invention.

FIG. 6 shows a circuit diagram of another embodiment of the present invention. In FIG. 6, the shaded components are added to the circuit diagram of FIG. 4. In the embodiment of FIG. 4, when faulty logic circuits are included among these being tested, the initializing operation has to be stopped for detecting and masking the faulty logic circuits and then the initializing operation is restarted. Therefore, the total time required for setting the initial state in the plurality of logic circuits, and thus the time required before starting the actual logic testing, becomes large. In the embodiment of FIG. 6, the faulty logic circuits can be detected and masked automatically without stopping and repeating the initializing operation, and the actual logic test can be immediately begun for the normal logic circuits.

In FIG. 6, the components that are identical to those in FIGS. 2 and 4 are denoted by the same reference characters. A timer 58 is provided for generating a time signal at a predetermined time after the start of the initializing operation. This time period is set to be equal to or slightly larger than the longest time required for the plurality of logic circuits to first attain the initial state in response to repetition of the increment pattern. That is, in the case of initializing the logic circuits which repeat the initial state every 16 times the increment pattern is supplied, as an example, the time period in the timer 58 is set to be equal to or larger than the time required for generating the increment pattern 16 times by the pattern generator. Therefore, regardless of the internal state of each logic circuit before the increment pattern is supplied, all the normal logic circuits can reach the initial state within the time period thus determined by the timer 58.

The timer signal from the timer 58 is provided to AND gates 53 and 54 whose other input terminals are provided with the output signals from the flip-flops 36 and 37, respectively. When the output of the flip-flop 36 or 37 is at low level, a high level signal is generated from the corresponding AND gate 53 and 54 in synchronism with the time signal from the timer 58. The outputs of the AND gates 53 and 54 are connected to storage devices 55 an 56, respectively. Outputs of the storage devices 55 and 56 are read out at terminals 47 and 48 through the AND gates 32 and 33, respectively, when the reading out signal 116 is supplied at the terminal 46. The outputs of the storate devices 55 an 56 are also provided to OR gates 51 and 52, respectively, to serve as masking signas when the outputs are at high level.

The time signal from the timer 58 is also provided to all input terminals of the AND gate 26 through the OR gates 34 and 35 so that an overall coincidence signal is generated by the AND gate 26 in synchronism with the time signal without regard to the actual internal states of the logic circuits under test. That is, the overall coincidence signal is generated compulsorily at the predetermined time after starting the initializing operation when faulty logic circuits are included among the logic circuits under test.

The flip-flops 36 and 37 are reset by the time signal provided via a delay circuit 49 and an OR gate 57. The delay time of the delay circuit 59 is set to be a sufficient time for storing the data from the flip-flops 36 and 37 in the storage devices 55 and 56 by the time signal 208 before the resetting of the flip-flops 36 and 37 by the overall coincidence signal. By the overall coincidence signal generated by the AND gate 26, the flip-flops 24, 25, 36 and 37 and the timer 58 are reset. The data in the storage devices 55 and 56 can be cleared by a clear signal from a terminal 71.

Figure 7:
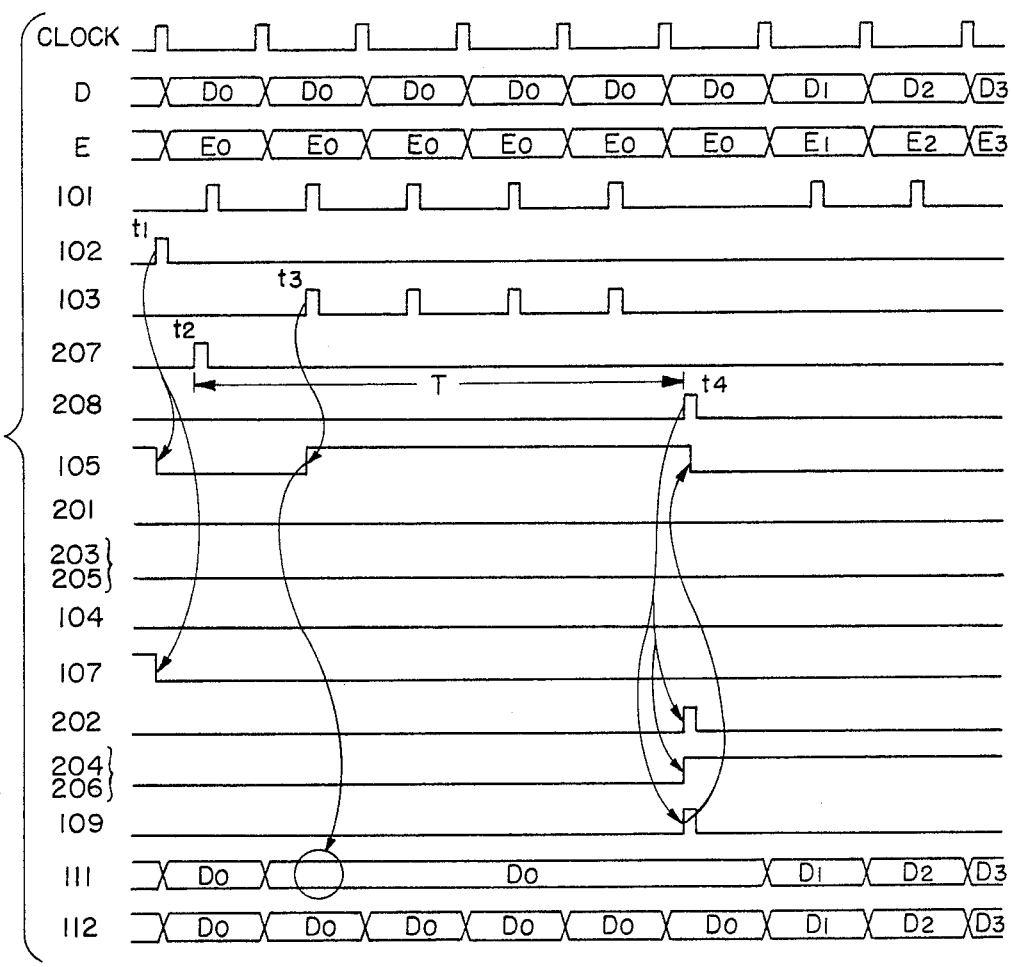
FIG. 7 is a timing chart for explaining the operation of the embodiment of FIG. 6.

FIG. 7 is a timing chart for explaining the operation of the embodiment of FIG. 6. In this example, again, the logic circuit 19 is assumed to be faulty, so that the initial state cannot be set by repeatedly providing the increment pattern. At the start of the initialization, at time $t_1$, the reset signal 102 is provided from the terminal 43 for resetting the flip-flops 24, 25, 36 and 37. The pattern generator 11 generates, in synchronism with the clock signal from terminal 49, the increment pattern $D_0$ which increments the internal state of the logic circuits under test and the expected pattern $E_0$ which indicates the initial state of the logic circuits under test. Also, at the start of the initializing operation, a timer start signal 207 is provided to the timer 58, at time $t_2$, to generate the time signal 208 after the predetermined time T which is selected as mentioned above.

With the timing of the strobe signal 101, the outputs of the logic circuits 13 and 19 are compared with the expected pattern $E_0$ by the comparators 15 and 20, and the resulting signals 103 and 104 are respectively generated. In this example, the logic circuit 13 assumes the initial state upon receiving the increment pattern $D_0$ two times. Therefore, at time $t_3$, the comparison signal 103 goes to high level, so that the flip-flops 36 and 24 are set. The Q output of the flip-flop 24 is provided to the AND gate 26 through the OR gate 34, and the Q output of the flip-flop 24 is provided to the hold circuit 16 to set the hold circuit 16 in the hold state. Thus the internal state of the logic circuit 13 is fixed to the initial state and does not differ from the initial state. Although the increment pattern $D_0$ is further repeatedly provided to the logic circuit 19, the initial state is not attained in the logic circuit 19 because it is faulty.

After the time T from the timer start signal 207, at time $t_4$, the time signal 208 is generated by the timer 58. In synchronism with the time signal 208, the overall coincidence signal 109 is generated, since the time signal 208 is provided to all input terminals of the AND gate 26 via the OR gates 34 and 35. The overall coincidence signal 109 is provided via terminal 41 to the controller (not shown), which controls the total operation of the logic circuit test system.

Also, by the time signal 208, the AND gates 53 and 54 are opened, so that the inverted signal from the flip-flops 36 and 37 are stored in the storage devices 55 and 56, respectively. In this example, the output of the flip-flop 37 is at low level, since the comparison signal 104 cannot go to high level and thus cannot set the flip-flop 37. Since the output of the flip-flop 37 is at low level, a high level signal, meaning that the logic circuit 19 is faulty, is stored in the storage device 56. The high level signal 204 thus stored by the storage device 56 is provided to the AND gate 26 through the OR gates 52 and 35 to serve as a masking signal. Thus the input terminal of the AND gate 26 corresponding to the logic circuit 19 is at high level regardless of the ouput of the comparator 20, so that the faulty logic circuit 19 is masked.

By receiving the overall coincidence signal 109 with the same timing of the time signal 208, the controller can judge that a faulty logic circuit is present in the plurality of logic circuits, and that the other logic circuits are already set to the initial state. The controller instructs the pattern generator 11 to start generating the actual test patterns $D_1$, $D_2$, $D_3$ . . . and the expected pattern $E_1$, $E_2$, $E_3$ . . . to test the normal logic circuit, in this example, the logic circuit 13, beginning with the initial state. If the overall coincidence signal 109 is generated earlier than the time signal, it is considered that all the logic circuits under test are normal and have been set to the initial state.

Figure 8:
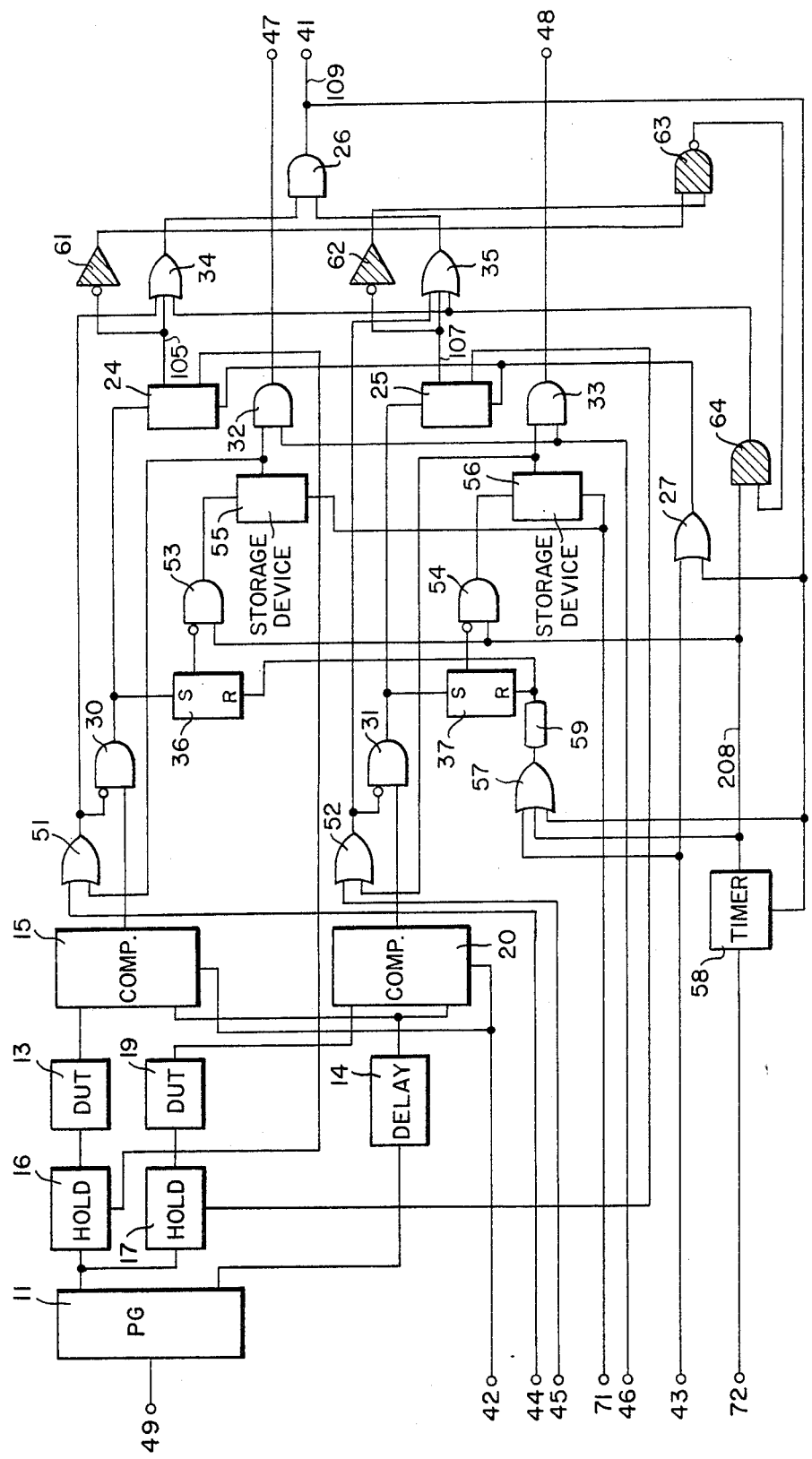
FIG. 8 shows a circuit diagram of another embodiment of the present invention.

FIG. 8 shows a circuit diagram of another embodiment of the present invention. In the embodiment of FIG. 6, even when all the logic circuits are faulty, the real test is followed immediately after the compulsory generation of the overall coincidence signal. However, this logic test is meaningless and time consuming, since all logic circuits are faulty. In the embodiment of FIG. 8, the initializing operation is discontinued and the actual logic test is eliminated when all logic circuits are faulty.

In FIG. 8, shaded components are added to the circuit diagram of FIG. 6 and the components identical to those in FIGS. 2, 4 and 6 are denoted by the same reference characters. The inverted outputs of flip-flops 24 and 25 are provided to inverters 61 and 62, respectively. The outputs of both inverters 61 and 62 are connected to and AND gate 63 whose inverted output is connected to an input of an AND gate 64. The other input of the AND gate 64 is provided with the outputs of the timer 58. That is, in the embodiment of FIG. 8, the time signal from the timer 58 is supplied to the AND gate 26 through the OR gates 34 and 35 only when the AND gate 64 is open.

When no logic circuits are in the initial state, the outputs of both flip-flops 24 and 25 are at low level and thus the outputs of both inverters 61 and 62 are at high level. As a result, the inverted output of the AND gate 63 is at low level, so that the AND gate 64 is closed. Therefore, the time signal 208 from the timer 58 cannot be supplied to the OR gates 34 and 35, so that the overall coincidence signal is not obtained in synchronism with the time signal 208. The controller can judge that all logic circuits are faulty because the overall coincidence signal is not obtained from the terminal 41 with the timing of the time signal 208. Thus the initializing operation is stopped by the controller, for example, to replace the faulty logic circuits with other logic circuits.

Figure 9:
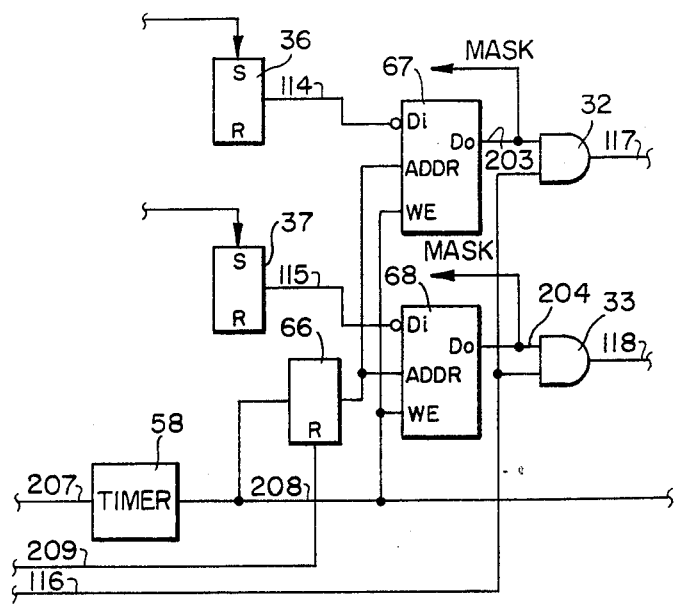
FIG. 9 shows a circuit diagram of a modified circuit configuration of the storage devices used in the embodiment of FIGS. 4, 6, and 8.

The storage devices 55 and 56 in the embodiment of FIGS. 6 and 8 show simple types of components such as set-reset flip-flops. It is also possible to comprise the storage devices 55 and 56 by the use of memories as shown in FIG. 9. In FIG. 9, the time signal 208 from the timer 58 is supplied to an address counter 66 to increment the address counter 66 to generate address data. The address data from the address counter 66 is provided to memories 67 and 68. The time signal 208 is also provided to memories 67 and 68 as a write enable signal.

When the time signal 208 is generated, the respective outputs from the flip-flops 36 and 37 are stored in the identical addresses of the memories 67 and 68 as determined by the address data from the address counter 66. After the time signal 208, that is, when the write enable signal is at low level, the data stored in the address determined by the address data from the address counter 66 are read out from the memories 67 and 68. If the read out data is at high level, this high level signal serves as a masking signal to mask the data of the corresponding faulty logic circuit.

In some logic circuits under test, the actual logic test has to be started after obtaining a plurality of initial states sequentially. For example, logic circuits may have to be set to the initial state $E_{02}$ before starting the actual test, wherein this initial state $E_{02}$ has to be obtained after first obtaining another initial state $E_{01}$. In this case, it is not satisfactory that the initial state $E_{02}$ occurs as a result of some uncertainty which arises, for example, when switching on the source power. Therefore, the initializing operation is repeated a plurality of times, in this case, tow times, under the control of the controller by providing the increment pattern $D_0$ and expected patterns corresponding to the initial states $E_{01}$ and $E_{02}$ of the logic circuits under test.

In the above example, the initialization for obtaining the first initial state $E_{01}$ in a plurality of logic circuits under test is executed first by providing the increment pattern $D_0$ and the expected pattern $E_{01}$, and immediately after generating the overall coincidence signal for the initial state $E_{01}$, the controller provides the timer start signal again and also commands the pattern generator to generate the increment pattern $D_0$ and the expected pattern $E_{02}$ for obtaining the second initial state $E_{02}$ in each of the logic circuits under test.

By the circuit arrangement of FIG. 9, data can be stored and read out for showing at which stage of the plurality of initializing operations and in which logic circuit among the plurality of logic circuits the faults occurred.

What is claimed is:

1. A system for testing a plurality of logic circuits having an initial state with respect to which test patterns are to be supplied, comprising
    a pattern generator for generating said test patterns and respective expected patterns, said test patterns including an increment pattern for incrementing the internal state of said logic circuits,
    a plurality of comparators for respectively comparing the outputs of said logic circuits corresponding to each said test pattern with the respective expected pattern, and for outputting respective coincidence signals when said outputs and the respective expected pattern coincide with each other,
    a plurality of hold command circuits for respectively generating hold command signals when said coincidence signals are outputted from said comparators, and
    a plurality of hold circuits for holding the supplying of said increment pattern to the respective ones of said logic circuits when said hold command signals are supplied from the respective ones of said hold command circuits.

2. The system of claim 1, comprising an overall coincidence signal generating means for generating an overall coincidence signal when the respective ones of said comparators, corresponding at least to the ones of said logic circuits that can be set to said initial state, output said coincidence signals.

3. The system of claim 2, wherein said overall coincidence signal generating means generates said overall coincidence signal only when all of said circuits have been set to said initial state.

4. The system of claim 1, comprising
    reading out means for selectively reading out the internal states of said logic circuits, and
    masking means for selectively masking said logic circuits according to the results obtained by said reading out means.

5. The system of claim 2, comprising
    reading out means for selectively reading out the internal states of said logic circuits, and
    masking means for selectively masking said logic circuits according to the results obtained by said reading out means,
    wherein said overall coincidence signal is provided after the masking of any faulty ones of said logic circuits, namely that cannot be set to said initial state by said increment pattern.

6. The system of clam 2, comprising
    a timer for generating a time signal with a predetermined timing after starting repeated generation of said increment pattern for setting said initial state in said logic circuits, said predetermined time corresponding at least to the amount of time for cycling the operable ones of said logic circuits between two successive occurrences of said initial state, and
    storage devices for storing data corresponding to the internal state of said logic circuits and for generating masking signals according to said stored data,
    wherein said overall coincidence signal generating means generates said overall coincidence signal in synchronism with said time signal regardless of the internal states of said logic circuits.

7. The system of claim 6, wherein said overall coincidence signal generating means has respective inputs corresponding to the outputs of said comparators, and said storage devices are flip-flops respectively connected between the outputs of said comparators and respective inputs to said overall coincidence signal generating means.

8. The system of claim 6, wherein said storage devices comprise a respective plurality of memories, and the outputs of said memories provide said masking signals corresponding to said faulty logic circuits.

9. The system of claim 6, wherein, when all of said logic circuits are faulty, said overall coincidence signal synchronism with said time signal is inhibited to prevent the ones of said test patterns following said increment pattern from being supplied to said logic circuits.

* * * * *